US006876078B2

United States Patent
Kim et al.

(10) Patent No.: US 6,876,078 B2
(45) Date of Patent: Apr. 5, 2005

(54) SEMICONDUCTOR INTERCONNECTION STRUCTURE WITH TAN AND METHOD OF FORMING THE SAME

(75) Inventors: Byung-Hee Kim, Seoul (KR); Gil-Heyun Choi, Gyeonggi-Do (KR); Kyung-In Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/461,613

(22) Filed: Jun. 13, 2003

(65) Prior Publication Data

US 2003/0230812 A1 Dec. 18, 2003

(30) Foreign Application Priority Data

Jun. 17, 2002 (KR) .................................. 10-2002-0033635

(51) Int. Cl.[7] .............................................. H01L 23/48
(52) U.S. Cl. ..................... 257/751; 257/750; 257/753; 257/761; 257/763; 257/765; 257/774
(58) Field of Search ............................... 257/751, 750, 257/753, 761, 763, 764, 765, 774, 773

(56) References Cited

U.S. PATENT DOCUMENTS 5,741,626 A * 4/1998 Jain et al. .................. 430/314

6,638,810 B2 * 10/2003 Bakli et al. ................. 438/240

FOREIGN PATENT DOCUMENTS

JP 11-340228 10/1999

OTHER PUBLICATIONS

English language of Abstract for Japanese Patent Publication No. 11–340228.

* cited by examiner

Primary Examiner—Nathan J. Flynn
Assistant Examiner—Remmon R. Fordé
(74) Attorney, Agent, or Firm—Marger Johnson & McCollom, P.C.

(57) ABSTRACT

A structure includes a diffusion barrier layer pattern, a conductive layer pattern, an adhesion layer pattern, and a tantalum nitride layer pattern that are sequentially stacked over a semiconductor substrate. According to the method of forming the structure, a tantalum nitride layer is formed by using a PVD, CVD, or ALD process and patterned to form a tantalum nitride layer pattern. The structure and the method prevents process failures such as ring defects, simplifies associated processes, and allows relatively easy exposure of only an anti-refractive layer when forming a via hole in the structure.

9 Claims, 5 Drawing Sheets

SEMICONDUCTOR INTERCONNECTION STRUCTURE WITH TAN AND METHOD OF FORMING THE SAME

CROSS REFERENCE TO RELATED APPLICATIONS

This application claims priority from Korean Patent Application No. 2002-33635, filed on Jun. 17, 2002, the contents of which are incorporated by reference in their entirety.

BACKGROUND OF THE INVENTION

1. Technical Field of the Invention

This disclosure relates to a semiconductor interconnection structure and a method of forming the same. More particularly, the disclosure relates to a semiconductor interconnection structure including a tantalum nitride (TaN) layer and a method of forming the same.

2. Description of the Related Art

A semiconductor device includes transistors, resistors, and capacitors. Interconnections between these elements are used to form the semiconductor device on a semiconductor substrate. The interconnections act as conductors for transmitted electrical signals. Therefore, the interconnections should have a low electrical resistance and be economical and reliable.

As semiconductor devices become more highly integrated, the width and thickness of interconnections are gradually reduced, and the size of contact holes is likewise decreased. This results in difficulty when forming interconnections.

FIG. 1 illustrates a cross-sectional view of a semiconductor interconnection structure according to a conventional method.

Referring to FIG. 1, an interlayer dielectric layer 2 is formed on a semiconductor substrate 1. A diffusion barrier layer 3, a conductive layer 5, an adhesion layer 7 and an anti-reflective layer 9 are sequentially stacked on the interlayer dielectric layer 2. The anti-reflective layer 9 is formed of titanium nitride (TiN), and the adhesion layer 7 is formed of titanium (Ti). The conductive layer 5 is formed of aluminum, and the diffusion barrier layer 3 is formed of titanium nitride (TiN). The anti-reflective layer 9, the adhesion layer 7, the conductive layer 5, and the diffusion barrier layer 3 are sequentially patterned by using a photoresist pattern in a photolithography process, to form sequentially stacked patterns 9, 7, 5 and 3. An interlayer dielectric layer 11 is formed to cover the patterns 9, 7, 5, and 3, and then patterned to expose the anti-reflective layer 9.

If a misalignment occurs during the photolithography process, the photoresist pattern should be removed by an ashing process, and a wet-cleaning process is carried out to remove organic residues remaining on the anti-reflective layer 9. Since a photoresist includes a photo acid generator (PAG) which generates an acid when exposed to light, an acid is generated by the photolithography process. Thus, when a subsequent cleaning process is performed, a cleaning solution is mixed with the generated acid to become a dilute acid.

Since aluminum, which is used for the conductive layer 5, has a property of being crystallized, a surface of the aluminum layer is not perfectly flat. That is, at the surface of the aluminum, a groove is formed at a boundary between crystallized aluminum grains. Thus, in a process of depositing titanium and titanium nitride on the surface of aluminum for the adhesion layer 7 and anti-reflective layer 9, respectively, it is difficult to deposit these layers at the groove. A titanium nitride deposited on the groove is thinner than that on the neighboring flat grains. Titanium nitride is chemically weak with respect to the dilute acid solution. Therefore, during the cleaning process, the thin and weak titanium nitride at the groove may be removed to expose titanium due to the weak chemical resistance. Also, the cleaning solution may damage or remove the exposed titanium and aluminum at the groove. Thus, the groove may get deeper. In this state, if a photoresist is coated again and a photolithography process is performed, the photoresist remains in the deepened groove to result in a ring defect along a boundary of an aluminum grain. The ring defect can cause a short between metal interconnections during operation of the semiconductor device, thereby lowering the reliability of a semiconductor device.

Furthermore, as space between interconnections is reduced due to the increased integration density of semiconductor devices, there is a limit to the method of forming a metal interconnection by using a photoresist pattern alone. To overcome this problem, an oxide pattern is formed on the anti-reflective layer of TiN and used as a hard mask to form a metal interconnection. But, this results in increased complexity to the overall process because an oxide pattern is additionally deposited and removed in a subsequent step.

In a multilayered interconnection structure of a semiconductor device, a via plug is formed to connect a bottom interconnection with an upper interconnection. When a via hole is formed for this purpose, only an anti-reflective layer on the bottom interconnection is exposed, or a conductive pattern of the bottom interconnection may be exposed. When the conductive pattern of the bottom interconnection is exposed, there may be a problem in a reliability of the bottom interconnection. The conductive pattern is generally formed of aluminum. When the aluminum is exposed, aluminum atoms migrate and crystallize to form grains in the surface of the aluminum. Thus, grooves are formed at the boundaries of the grains. The grooves between the aluminum grains are too fine to be filled in using a subsequent via hole-filling process. The very fine voids formed in this manner cause a problem in the reliability of the interconnection. Therefore, when the via hole is formed, only an anti-reflective layer is generally and preferably exposed.

However, an oxide intermetal dielectric layer 11 has a low etch selectivity with respect to the titanium nitride layer 9. Thus, when a via hole 13 is formed to expose the anti-reflective layer 9, the titanium nitride layer 9 may also be etched, as shown in FIG. 1. In addition, the etching may be so severe as to expose the aluminum layer 5. In order to prevent the aluminum layer 5 from being exposed, a relatively thick titanium nitride layer 9 is typically required. Since the titanium nitride layer 9 is thick, the total height of the interconnection becomes excessive and it is difficult to fill the space between the interconnections with the intermetal dielectric layer 11.

Embodiments of the invention address these and other problems with convention processes.

SUMMARY OF THE INVENTION

Embodiments of the invention provide a semiconductor interconnection structure and a method of forming the same. According to these embodiments, a resultant structure resists process failures such as ring defects and makes it relatively easy to expose an anti-reflective layer, without requiring an additional oxide pattern.

DETAILED DESCRIPTION OF THE INVENTION

The invention will now be described more filly hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. As used herein, the term "on", as when a layer is described as being "on" another layer, may be defined as being directly on top of the other layer, or on top of the other layer with one or more intervening layers between them. Like numbers refer to like elements throughout and in each drawing.

Figure 2:
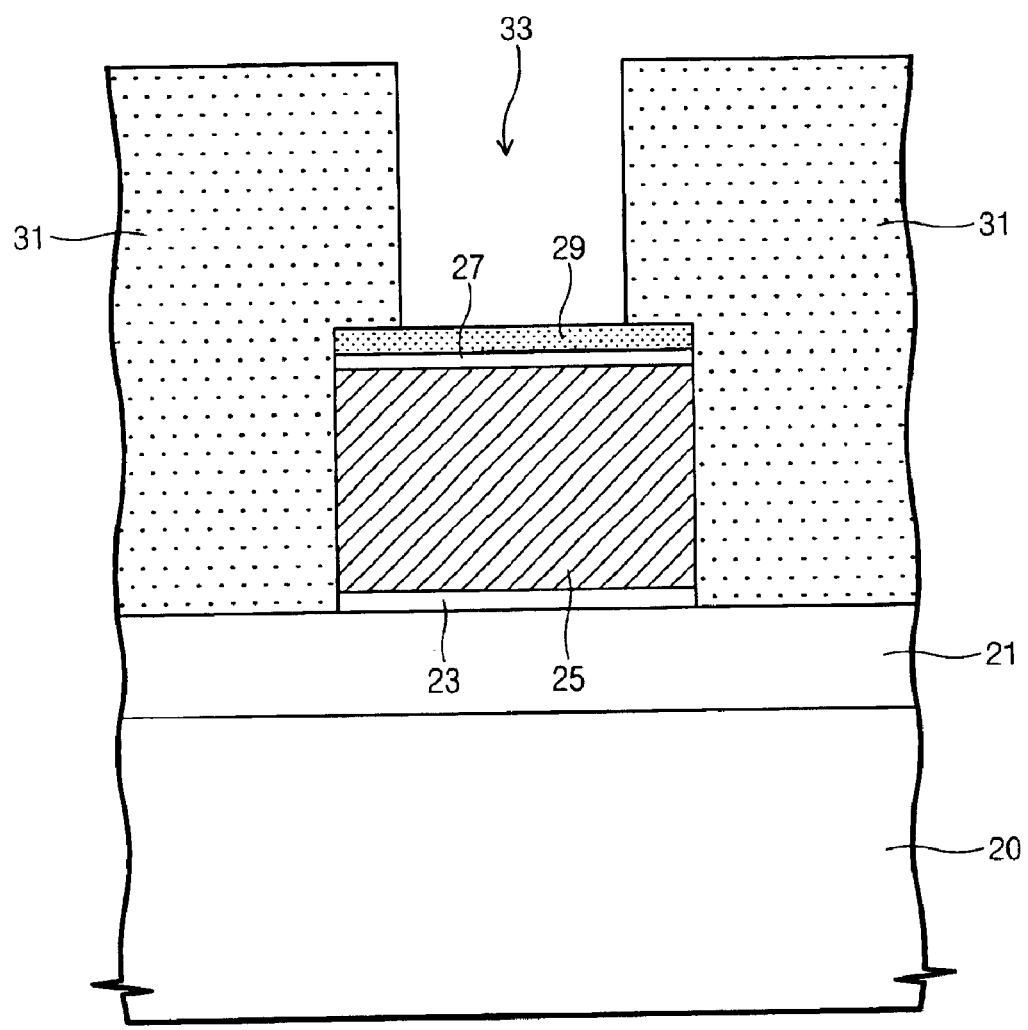
FIG. 2 is a cross-sectional diagram of a semiconductor interconnection structure according to an embodiment of the invention.

FIG. 2 is a cross-sectional diagram of a semiconductor interconnection structure according to an embodiment of the invention.

Referring to FIG. 2, an interlayer dielectric layer 21 is formed on a semiconductor substrate 20. An interconnection including a sequentially stacked diffusion barrier layer pattern 23, a conductive layer pattern 25, an adhesion layer pattern 27, and an anti-reflective layer pattern 29 is formed on the interlayer dielectric layer 21. An intermetal dielectric layer 31 covers the interconnection. A via hole 33 penetrates a portion of the intermetal dielectric layer 31 and exposes the anti-reflective layer pattern 29. The anti-reflective layer 29 can be formed of tantalum nitride (TaN), for instance.

Figure 3A:
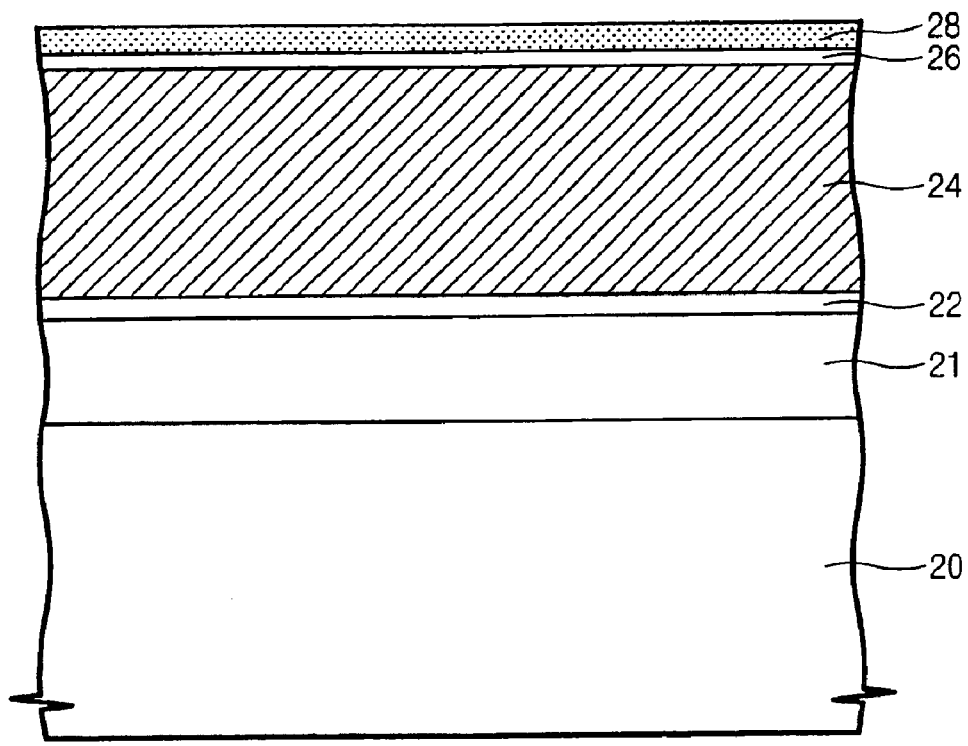
FIGS. 3A through 3C are cross-sectional diagrams illustrating method processes for forming a semiconductor interconnection structure according to embodiments of the invention.
Figure 3B:
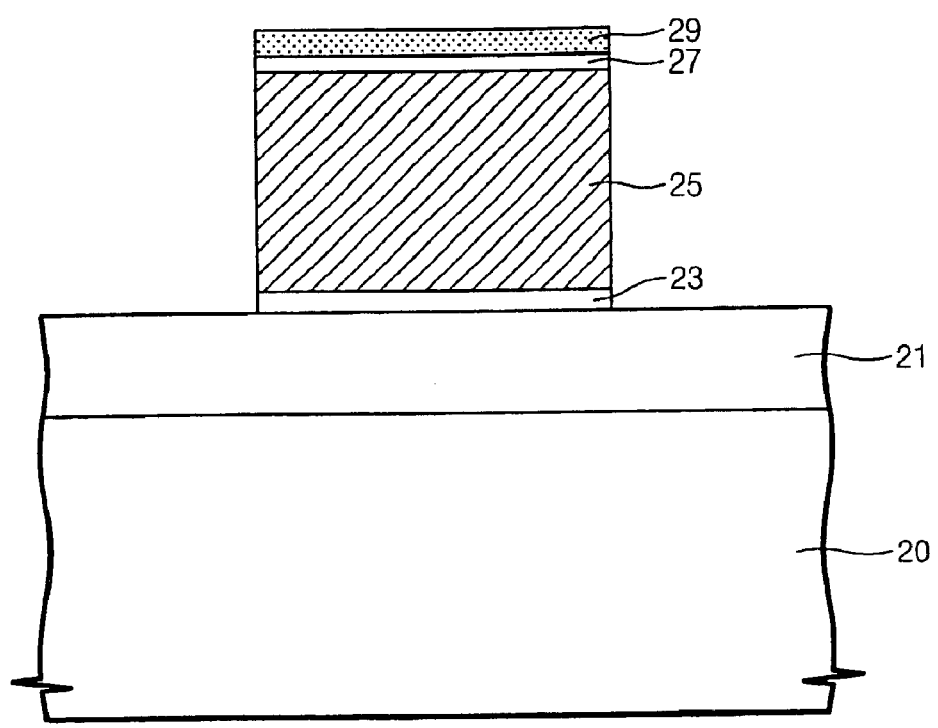
Figure 3C:
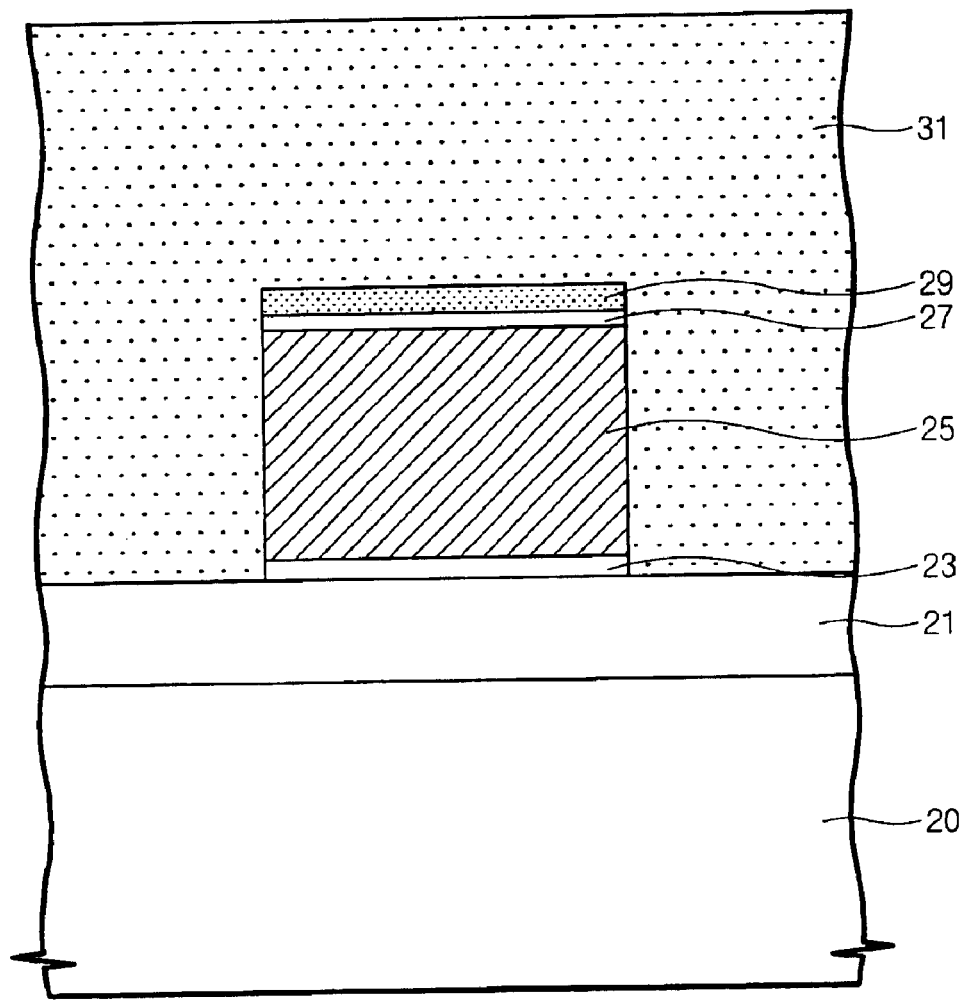

FIGS. 3A through 3C are cross-sectional diagrams illustrating processes for forming a semiconductor interconnection structure according to embodiments of the invention.

Figure 1:
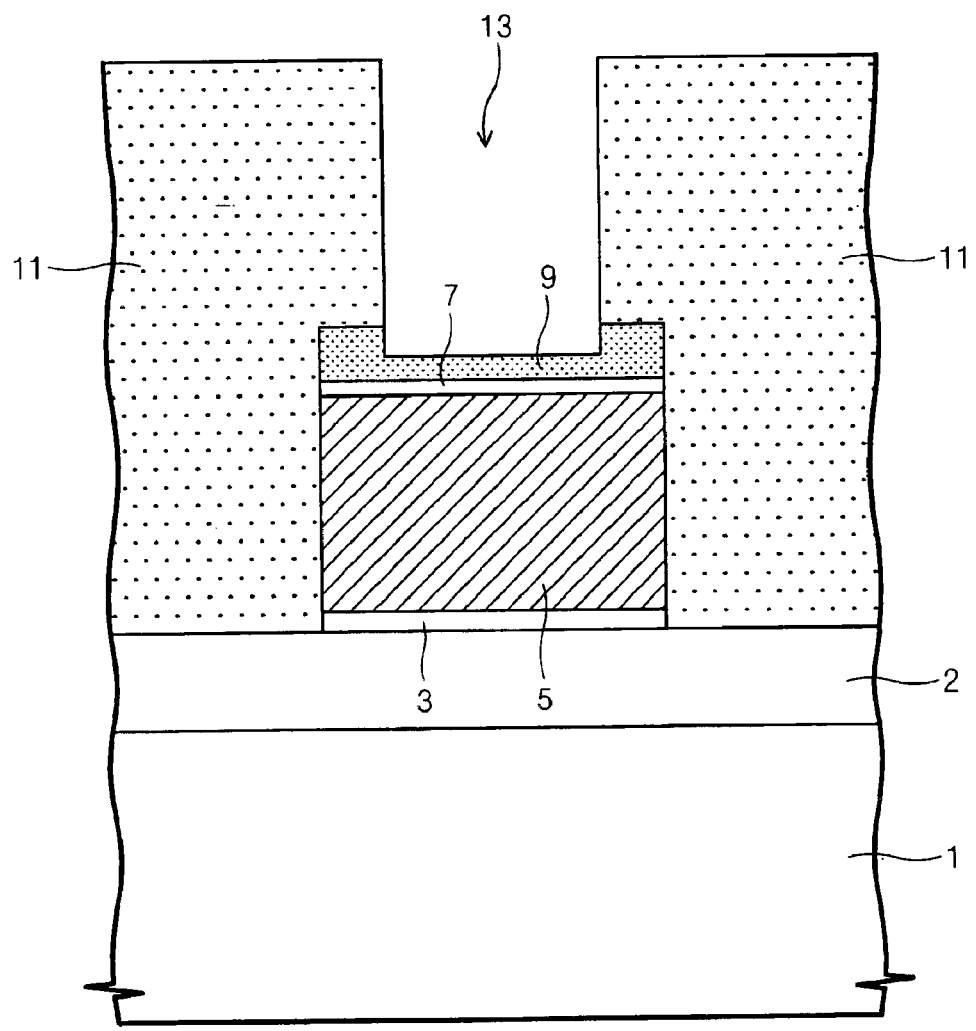
FIG. 1 is a cross-sectional diagram of a conventional semiconductor interconnection structure.

Referring to FIG. 3A, an interlayer dielectric layer 21 is formed on a semiconductor substrate 20. A diffusion barrier layer 22, a conductive layer 24, an adhesion layer 26, and an anti-reflective layer 28 are sequentially stacked on the interlayer dielectric layer 21. The diffusion barrier layer 22 can be formed of a single layer of titanium (Ti) or titanium nitride (TiN), or formed of a dual layer of titanium/titanium nitride (Ti/TiN), for instance. The conductive layer 24 may be formed of aluminum or tungsten. The adhesion layer 26 is formed of titanium or tantalum. If the conductive layer 24 is formed of aluminum and the adhesion layer 26 is formed of titanium, a titanium aluminum compound $TiAl_3$ is formed at a boundary between the conductive layer 24 and the adhesion layer 26. The titanium aluminum compound $TiAl_3$ suppresses migration of the conductive layer 24 of aluminum and prevents formation of aluminum grains at a surface of the conductive layer 24. The anti-reflective layer 28 is formed of tantalum nitride (TaN), for example, with a thickness of 50~500 Å. This is thinner than a conventional anti-reflective layer pattern 9 of FIG. 1. The anti-reflective layer 28 can be formed by plasma-vapor deposition (PVD), chemical vapor deposition (CVD) or atomic layer deposition (ALD), for instance. Additionally, during the formation of the anti-reflective layer 28, ammonia (NH3) and at least one material such as terbutylimido-tris-diethyl amino tantalum (TBTDET), pentadimetylamio-tatalum (PDMAT), pentaethylmetylamino-tantalum (PEMAT), $TaF_5$, $TaCl_5$, $TaBr_5$, and $TaI_5$ are supplied.

The anti-reflective layer 28, the adhesion layer 26, the conductive layer 24 and the diffusion barrier layer 22 are sequentially patterned to form an interconnection including a diffusion barrier layer pattern 23, a conductive layer pattern 25, an adhesion layer pattern 27, and an anti-reflective layer pattern 29, as shown in FIG. 3B. At this time, in the patterning process, the layers 28, 26, 24, and 22 of FIG. 3A are successively patterned by using a photoresist pattern as an etch mask. Alternatively, the anti-reflective layer 28 is first patterned by using a photoresist pattern and then the other layers 26, 24 and 22 are successively patterned by using the anti-reflective layer pattern 29 as an etch mask.

Tantalum nitride, which is used for the anti-reflective layer portion 29, has an etch selectivity that is seven times higher than titanium nitride with respect to the conductive layer 25. Thus, the tantalum nitride may be used as a hard mask. Also, the tantalum nitride has a strong chemical resistance to prevent forming the aforementioned ring defect.

An intermetal dielectric layer 31 is stacked to cover the interconnection, as seen in FIG. 3C. The anti-reflective layer pattern 29 of tantalum nitride can be made thinner than the conventional one of titanium nitride due to the high etch selectivity thereof. Therefore, the total height of the interconnection is lowered, so that it is relatively easy to fill the spaces between interconnections with the intermetal dielectric layer 31. The intermetal dielectric layer 31 is generally formed of an oxide. The intermetal dielectric layer 31 is patterned to form a via hole 33 as shown in FIG. 2, exposing the anti-reflective layer pattern 29. Because the anti-reflective layer pattern 29 is etched less than the intermetal dielectric layer 31 of oxide, it is relatively easy to expose only the anti-reflective layer 29 when the via hole 33 is formed as shown in FIG. 2.

According to embodiments of the invention, the semiconductor interconnection structure and the method of forming the same use tantalum nitride as an anti-reflective layer instead of titanium nitride to prevent process failures such as ring defects, to simplify processes without additionally forming an oxide pattern, and to easily expose only an anti-reflective layer when forming a via hole.

Embodiments include a semiconductor interconnection structure having a tantalum nitride (TaN) layer. Such a layer has a good chemical resistance and a good etch selectivity with respect to an intermetal dielectric layer, and functions as a hard mask.

More particularly, a semiconductor interconnection structure according to specific embodiments of the invention includes a semiconductor substrate; a diffusion barrier layer pattern over the semiconductor substrate; a conductive layer pattern on the diffusion barrier layer pattern; an adhesion layer pattern on the conductive layer pattern; and a tantalum nitride (TaN) layer pattern on the adhesion layer pattern. The semiconductor interconnection structure may further include an interlayer dielectric layer interposed between the semiconductor substrate and the diffusion barrier layer pattern. The semiconductor interconnection structure may further include an intermetal dielectric layers covering the patterns and a via hole exposing the tantalum nitride layer pattern through the intermetal dielectric layer. The conductive layer pattern can be composed of aluminum (Al) or tungsten (W). The adhesion layer pattern is formed of titanium (Ti) or tantalum (Ta), for instance.

Methods for forming a semiconductor interconnection structure including a tantalum nitride (TaN) layer are also disclosed. According to these methods, a diffusion barrier, a conductive layer, an adhesion layer, and a tantalum nitride layer are sequentially formed over a semiconductor substrate. The tantalum nitride layer, the adhesion layer, the conductive layer, and the diffusion barrier layer are sequentially patterned to form an interconnection composed of a diffusion barrier layer pattern, a conductive layer pattern, and adhesion layer pattern and a tantalum nitride layer pattern which are sequentially stacked. Before forming the diffusion barrier layer, an interlayer dielectric layer may be stacked on the semiconductor substrate.

The tantalum nitride layer may be formed by using PVD, CVD, or ALD, and further by supplying ammonia ($NH_3$) and a material such as terbutylimido-tris-diethyl amino tantalum (TBTDET), pentadimetylamio-tatalum (PDMAT), pentaethylmetylamino-tantalum (PEMAT), $TaF_5$, $TaCl_5$, $TaBr_5$, and $TaI_5$.

An intermetal dielectric layer is formed to cover the interconnection and patterned to form a via hole exposing the tantalum nitride layer pattern through the intermetal dielectric layer. The patterning of the tantalum nitride layer, the adhesion layer, the conductive layer and the diffusion barrier layer includes: patterning the tantalum nitride layer to form a tantalum nitride layer pattern; and successively patterning the adhesion layer, the conductive layer and the diffusion barrier layer by using the tantalum nitride layer pattern.

According to embodiments of the invention, the tantalum nitride has a strong chemical resistance that prevents ring defects. Also, tantalum nitride has a high etch selectivity with respect to aluminum and can be used as a hard mask. When the via hole is formed to expose the tantalum nitride through the intermetal dielectric layer, it is easy to expose only the anti-reflective layer since the tantalum nitride layer has a high etch selectivity with respect to the intermetal dielectric layer. Thus, the anti-reflective layer pattern of tantalum nitride is thinner than the conventional one of titanium nitride due to its high etch selectivity. Therefore, the total height of the interconnection is reduced, so that it is easy to fill the entire space between interconnections with the intermetal dielectric layer.

What is claimed is:

1. A semiconductor interconnection structure comprising:
   a semiconductor substrate;
   a diffusion barrier layer pattern over the semiconductor substrate;
   a conductive layer pattern on the diffusion barrier layer pattern;
   an adhesion layer pattern on the conductive layer pattern; and
   a tantalum nitride (TaN) layer pattern on the adhesion layer pattern.

2. The semiconductor interconnection structure as claimed in claim 1, further comprising an interlayer dielectric layer interposed between the semiconductor substrate and the diffusion barrier layer pattern.

3. The semiconductor interconnection structure as claimed in claim 1, further comprising an intermetal dielectric layer covering the patterns.

4. The semiconductor interconnection structure as claimed in claim 3, further comprising a via hole through the intermetal dielectric layer exposing the tantalum nitride layer pattern.

5. The semiconductor interconnection structure as claimed in claim 1, wherein the conductive layer pattern comprises aluminum (Al).

6. The semiconductor interconnection structure as claimed in claim 1, wherein the conductive layer pattern comprises tungsten (W).

7. The semiconductor interconnection structure as claimed in claim 1, wherein the adhesion layer pattern comprises titanium (Ti).

8. The semiconductor interconnection structure as claimed in claim 1, wherein the adhesion layer pattern comprises tantalum (Ta).

9. A semiconductor interconnection structure comprising:
   a semiconductor substrate;
   a diffusion barrier layer pattern over the semiconductor substrate;
   an aluminum conductive layer pattern on the diffusion barrier layer pattern;
   a tantalum adhesion layer pattern on the aluminum conductive layer pattern; and
   a tantalum nitride (TaN) layer pattern on the adhesion layer pattern.

* * * * *

UNITED STATES PATENT AND TRADEMARK OFFICE
CERTIFICATE OF CORRECTION

| | | |
|---|---|---|
| PATENT NO. | : 6,876,078 B2 | Page 1 of 1 |
| APPLICATION NO. | : 10/461613 | |
| DATED | : April 5, 2005 | |
| INVENTOR(S) | : Kim et al. | |

It is certified that error appears in the above-identified patent and that said Letters Patent is hereby corrected as shown below:

On the Title Page, item 54, please replace "WITH TAN" with -- WITH TaN--

At column 1, line 2, please replace "WITH TAN" with -- WITH TaN --

Signed and Sealed this

Seventeenth Day of October, 2006

JON W. DUDAS
*Director of the United States Patent and Trademark Office*